(12) United States Patent
Kim et al.

(10) Patent No.: US 12,424,474 B2
(45) Date of Patent: Sep. 23, 2025

(54) ARTICLE TRANSFER APPARATUS AND METHOD FOR TRANSFERRING ARTICLE

(71) Applicant: SEMES CO., LTD., Cheonan-si (KR)

(72) Inventors: Won Young Kim, Yongin-si (KR); Keun Woo Kim, Cheonan-si (KR); Tae Uk Park, Ulsan (KR); Hyuk Jae Sung, Cheonan-si (KR)

(73) Assignee: Semes Co., Ltd., Chungcheongnam-do (KR)

(*) Notice: Subject to any disclaimer, the term of this patent is extended or adjusted under 35 U.S.C. 154(b) by 315 days.

(21) Appl. No.: 18/145,494

(22) Filed: Dec. 22, 2022

(65) Prior Publication Data
US 2023/0207362 A1    Jun. 29, 2023

(30) Foreign Application Priority Data

Dec. 27, 2021  (KR) .................. 10-2021-0189026
May 26, 2022  (KR) .................. 10-2022-0064672

(51) Int. Cl.
*H01L 21/677* (2006.01)
*H01L 21/67* (2006.01)
*H01L 21/687* (2006.01)

(52) U.S. Cl.
CPC .. *H01L 21/67724* (2013.01); *H01L 21/67294* (2013.01); *H01L 21/67727* (2013.01); *H01L 21/67733* (2013.01); *H01L 21/68707* (2013.01)

(58) Field of Classification Search
CPC .......... H01L 21/6773; H01L 21/67727; H01L 21/67733; H01L 21/67724; H01L 21/68707; H01L 21/67736; H01L 21/67769; H01L 21/67294; H01L 21/67259; H01L 21/67242
See application file for complete search history.

(56) References Cited

U.S. PATENT DOCUMENTS

| | | | |
|---|---|---|---|
| 9,938,120 B2 * | 4/2018 | Tomida | H01L 21/67733 |
| 2015/0255318 A1 * | 9/2015 | Wada | H01L 21/67265 212/71 |

FOREIGN PATENT DOCUMENTS

| | | |
|---|---|---|
| CN | 104773450 A | 7/2015 |
| JP | H075102 | 2/1995 |
| JP | 2003-171081 A | 6/2003 |
| KR | 10-2015-0083799 A | 7/2015 |

OTHER PUBLICATIONS

Korean Office Action dated Nov. 21, 2023 for corresponding Korean Patent Application No. 10-2022-0064672.

* cited by examiner

*Primary Examiner* — Glenn F Myers
(74) *Attorney, Agent, or Firm* — HARNESS, DICKEY & PIERCE, P.L.C.

(57) ABSTRACT

Disclosed is an article transfer apparatus. The article transfer apparatus includes a vehicle that travels along a driving rail installed on a ceiling, a hoist module that picks up an article-to-be-transferred, a vehicle body, on which the hoist module is mounted and which is connected to the vehicle, a drop preventing member provided in the vehicle body, and that prevents the article-to-be-transferred from dropping while the vehicle travels, and a controller that receives loading/unloading information of the article-to-be transferred to determine a size of the article-to-be-transferred, and to drive the drop preventing member according to a size of the article-to-be transferred.

9 Claims, 6 Drawing Sheets

ARTICLE TRANSFER APPARATUS AND METHOD FOR TRANSFERRING ARTICLE

CROSS-REFERENCE TO RELATED APPLICATIONS

This application claims priority under 35 U.S.C. § 119 to Korean Patent Application No. 10-2021-0189026 filed on Dec. 27, 2021 and Korean Patent Application No. 10-2022-0064672 filed on May 26, 2022, in the Korean Intellectual Property Office, the disclosures of which are incorporated by reference herein in their entireties.

BACKGROUND

Embodiments of the inventive concept described herein relate to an article transfer apparatus and a method thereof.

In general, to manufacture a semiconductor device, various kinds of processes, such as deposition, photographing, and etching processes, and apparatus that perform the processes are disposed in a semiconductor manufacturing line. A target article, such as a wafer or a mask, for performing a semiconductor device manufacturing process may be provided to various semiconductor process apparatuses while being received in a container. Furthermore, the target article, on which the processes have been performed, may be retrieved in a container, and the retrieved container may be transferred to an outside.

The container is fed by an overhead hoist transport (hereinafter, OHT). The OHT feeds the container, in which the target article is received, to a load port of any one of semiconductor process apparatuses. Furthermore, the OHT may pick up the container, in which the treated target article is received, from the load port to an outside or may transfer the container to another one of the semiconductor process apparatuses.

The OHT may generate vibrations during driving along the driving rail, and the container may be separated and drop due to the vibrations. To prevent this, the OHT is provided with a drop preventing member, and setting locations of the drop preventing member are different according to a size of the container that is to be transferred. Conventionally, a measurement part that acquires width information of the container is installed to adjust an interval of the drop preventing member according to the width information of the container, which is acquired by the measurement part.

SUMMARY

An aspect of the inventive concept provides an article transfer apparatus and an article transferring method, by which a movement interval of a drop preventing member may be adjusted with no measurement part that detects a width of a container.

The aspect of the inventive concept is not limited thereto, and other unmentioned aspects of the inventive concept may be clearly appreciated by those skilled in the art from the following descriptions.

According to an aspect of the inventive concept, an article transfer apparatus includes a vehicle that travels along a driving rail installed on a ceiling, a hoist module that picks up an article-to-be-transferred, a vehicle body, on which the hoist module is mounted and which is connected to the vehicle, a drop preventing member provided in the vehicle body, and that prevents the article-to-be-transferred from dropping while the vehicle travels, and a controller that receives loading/unloading information of the article-to-be-transferred to determine a size of the article-to-be-transferred, and to drive the drop preventing member according to a size of the article-to-be transferred.

The drop preventing member may include a pair of support parts that are moved horizontally toward a bottom surface of the article-to-be-transferred, and a driving part provided in an interior of the vehicle body, and that adjusts an interval between the pair of support parts.

The article transfer apparatus may further include a stock detecting sensor part that detects whether the article-to-be-transferred is present in an interior of the vehicle body.

The stock detecting sensor part may detect a flange of the article-to-be-transferred, which is gripped by the hoist module.

According to another aspect of the inventive concept, a transfer method of an article transfer apparatus includes gripping the article-to-be-transferred and moving the article-to-be-transferred into an accommodation space of a vehicle body, detecting whether the article-to-be-transferred is present in the accommodation space, determining a size of the article-to-be-transferred through loading/unloading information of the article-to-be-transferred when the article-to-be-transferred is detected, driving the drop preventing member according to a size of the article-to-be-transferred, and causing the article-to-be-transferred to travel to a transfer destination in a state, in which the article-to-be-transferred is prevented from dropping by the drop preventing member.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
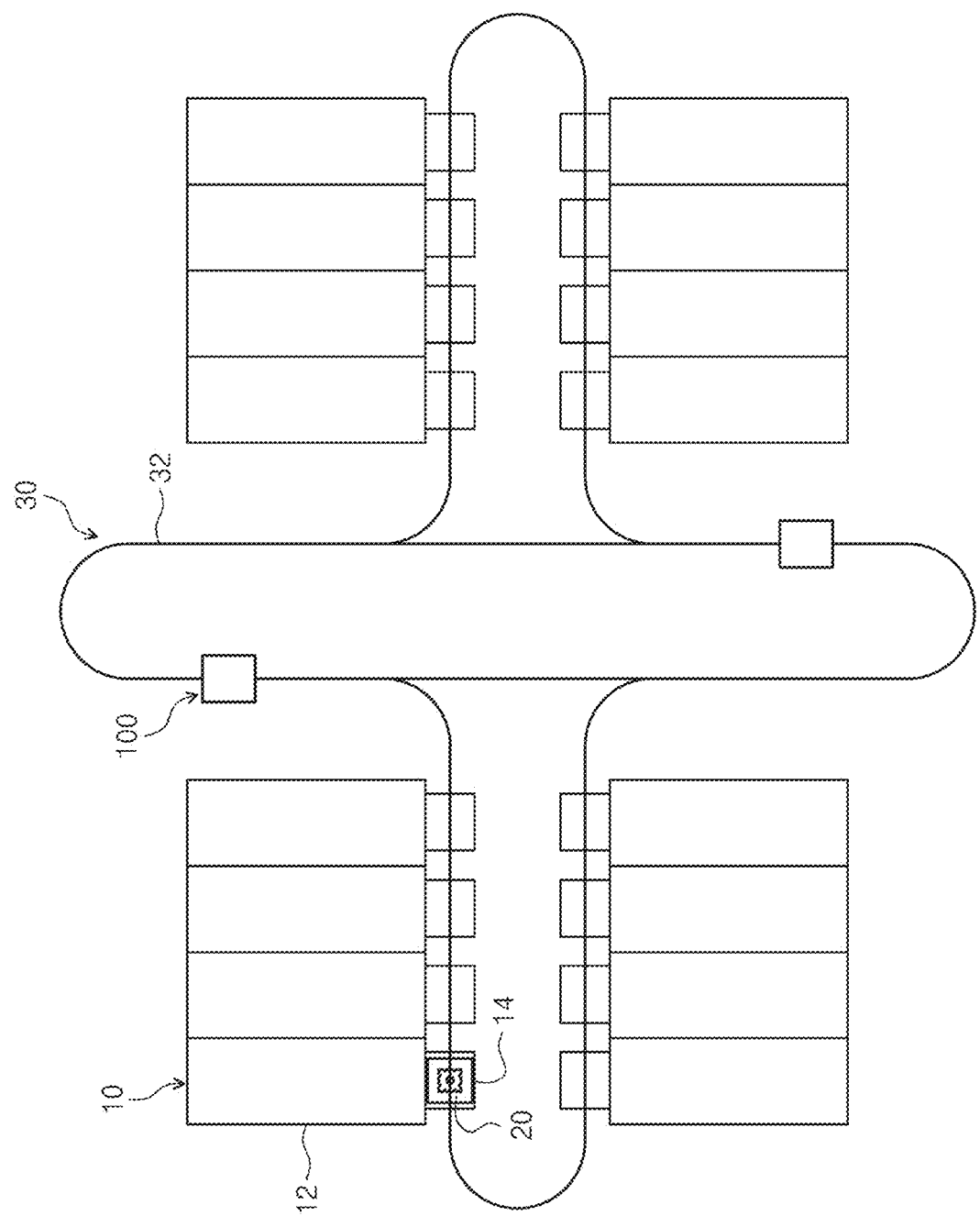
FIG. 1 is a plan view of a transfer facility including an article transfer apparatus.

Hereinafter, exemplary embodiments of the inventive concept will be described in detail with reference to the accompanying drawings so that those skilled in the art to which the inventive concept pertains may easily carry out the inventive concept. However, the inventive concept may be implemented in various different forms, and is not limited to the embodiments. Furthermore, in a detailed description of the preferred embodiment of the inventive concept, a detailed description of related known functions or configurations will be omitted when they may make the essence of the inventive concept unclear. In addition, the same reference numerals are used for parts that perform similar functions and operations throughout the drawings.

The expression of 'including' some components may mean that another component may be further included without being excluded unless there is a particularly contradictory description. In detail, the terms "including" and "having" are used to designate that the features, the numbers, the steps, the operations, the components, the parts, or combination thereof described in the specification are present, and may be understood that one or more other features, numbers, step, operations, components, parts, or combinations thereof may be added.

The terms of a singular form may include plural forms unless otherwise specified. Furthermore, in the drawings, the shapes and sizes of the components may be exaggerated for clearer description.

The terms such as first and second may be used to describe various components, but the components are not limited to the terms. The terms may be used only for the purpose of distinguishing one component from another component. For example, while not deviating from the scope of the inventive concept, a first component may be named a second component, and similarly, the second component may be named the first component.

When it is mentioned that one component is "connected to" or "electrically connected to" another component, it should be understood that the first component may be directly connected or electrically connected to the second component but a third component may be provided therebetween. On the other hand, when it is mentioned that a component is "directly connected to" or "directly electrically connected to" another component, it should be understood that a third component is not present between them. It should be construed that other expressions that describe the relationships between components, such as "between", "directly between", "adjacent to", and "directly adjacent to" may have the same purpose.

In addition, unless defined otherwise, all terms used herein, including technical or scientific terms, have the same meanings as those generally understood by those skilled in the art to which the inventive concept pertains. The terms defined in the generally used dictionaries should be construed as having the meanings that coincide with the meanings of the contexts of the related technologies, and should not be construed as ideal or excessively formal meanings unless clearly defined in the specification of the inventive concept.

The above detailed description exemplifies the inventive concept. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, it should be construed that the attached claims include other embodiments.

Figure 2:
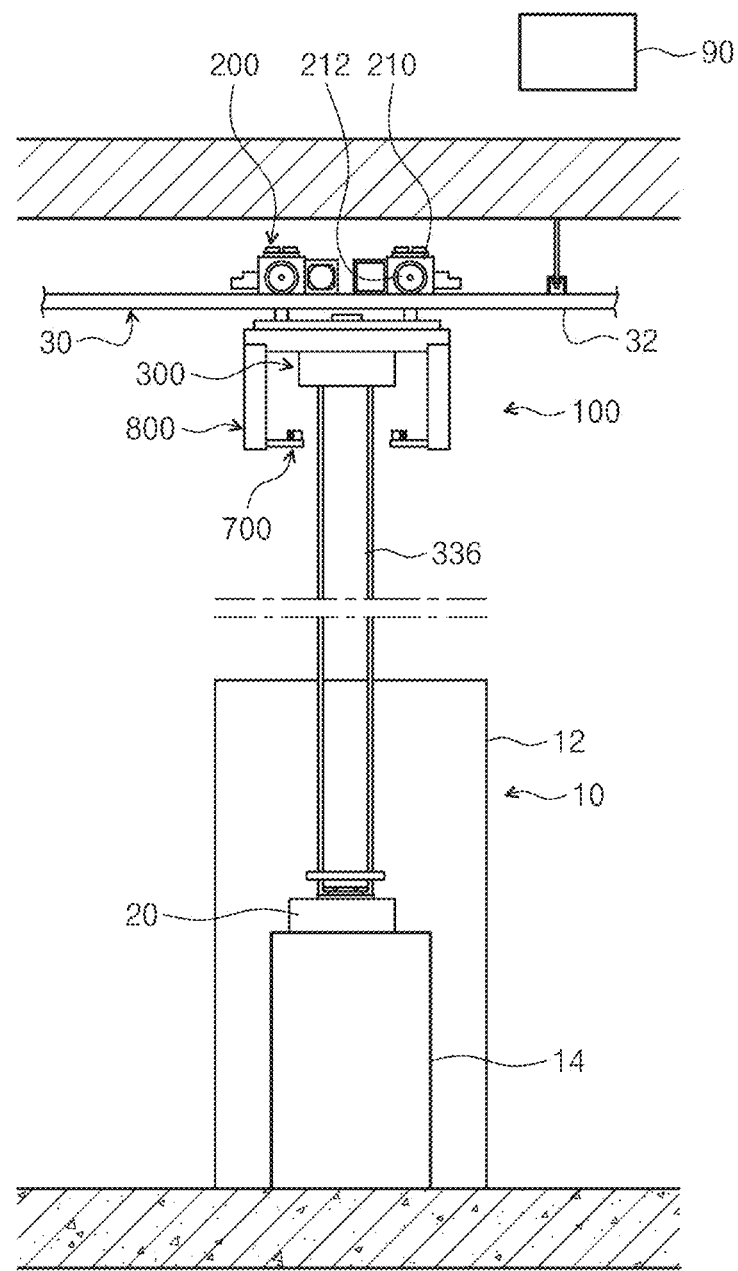
FIG. 2 is a side view of an article transfer apparatus, which illustrates a situation, in which an article-to-be-transferred is handed to a mounting site.

FIG. 1 is a plan view of a transfer facility including an article transfer apparatus. FIG. 2 is a side view of an article transfer apparatus, which illustrates a situation, in which an article-to-be-transferred is handed to a mounting site.

As illustrated in FIGS. 1 and 2, the article transfer apparatus 100 may include a transfer cart that transfers an article-to-be-transferred 20 to a transfer target site 10.

In the present embodiment, the article transfer apparatus 100 transfers the article-to-be-transferred 20 to the transfer target site 10 in a transfer facility including a plurality of transfer target sites 10. The article-to-be-transferred 20 is a transfer target, and for example, may be a single article or may be a combination of a plurality of articles, such as an accommodation article and a container that accommodates the accommodation article. In the present embodiment, the article-to-be-transferred 20 may be a container that accommodates a photo mask. As in FIGS. 5A and 5B, the article-to-be-transferred 20 includes a small size article-to-be-transferred and a large size article-to-be-transferred, a volume of which is larger than that of the small size article-to-be-transferred. In the present embodiment, the small size article-to-be-transferred 6S is a container that accommodates a phase shift mask as a photo mask, and the large size article-to-be-transferred 6L is a container that accommodates an extreme ultraviolet (EUV) mask as a photo mask. However, the article-to-be-transferred is not limited thereto, and may be a substrate receiving container, such as a front opening unified pod (FOUP), in which a plurality of substrates are received.

In the present embodiment, the transfer target site 10 may include a treatment apparatus 12 for treating a semiconductor substrate, and a mounting site 14, on which the article-to-be-transferred 20 is to be mounted. For example, the treatment apparatus 12 may be used to extract a photo mask from the article-to-be-transferred 20, on which the mounting site 14 is mounted, and treat the semiconductor substrate.

As illustrated in FIG. 1, a plurality of transfer target sites 10 may be provided in a transfer facility. A transfer path 30, via which the plurality of transfer target sites 10 pass, is installed in the transfer facility.

As illustrated in FIG. 2, in the present embodiment, the transfer path 30 is determined by a driving rail 32 connected to a ceiling. Furthermore, the mounting site 14 may be installed on a lower side of the driving rail 32 and be installed to overlap the driving rail 32 when viewed on a plane as well (see FIG. 1). Referring to FIG. 1, the driving rail 32 may include a linear section and a curved section.

In the present embodiment, the article transfer apparatus 100 may be an overhead hoist transport (OHT) apparatus. The article transfer apparatus may be driven on a driving rail 32 to transfer the article-to-be-transferred 20 to the transfer target site 10. In the present embodiment, a plurality of article transfer apparatuses 100 are provided in the transfer facility. Furthermore, as illustrated in FIG. 2, the article transfer apparatus 100 may feed the article-to-be-transferred, and transfers the article-to-be-transferred 20 to the mounting site 14. In other words, the article transfer apparatus 100 lowers the article-to-be-transferred 20 from a height (a height of the driving rail 32), at which the article transfer apparatus 100 is disposed, toward the mounting site 14 installed on a lower side thereof, and mounts the article-to-be-transferred 20 on the mounting site 14.

Hereinafter, an example of transferring a container, in which a photo mask is received, to semiconductor process apparatuses disposed in a semiconductor manufacturing line, by the article transfer apparatus 100 will be described. However, the inventive concept is not limited thereto, and the article transfer apparatus of the present embodiment also may be applied to various manufacturing lines that require transfer of an article and/or a container, in which an article is received, in the same or similar way.

Figure 3:
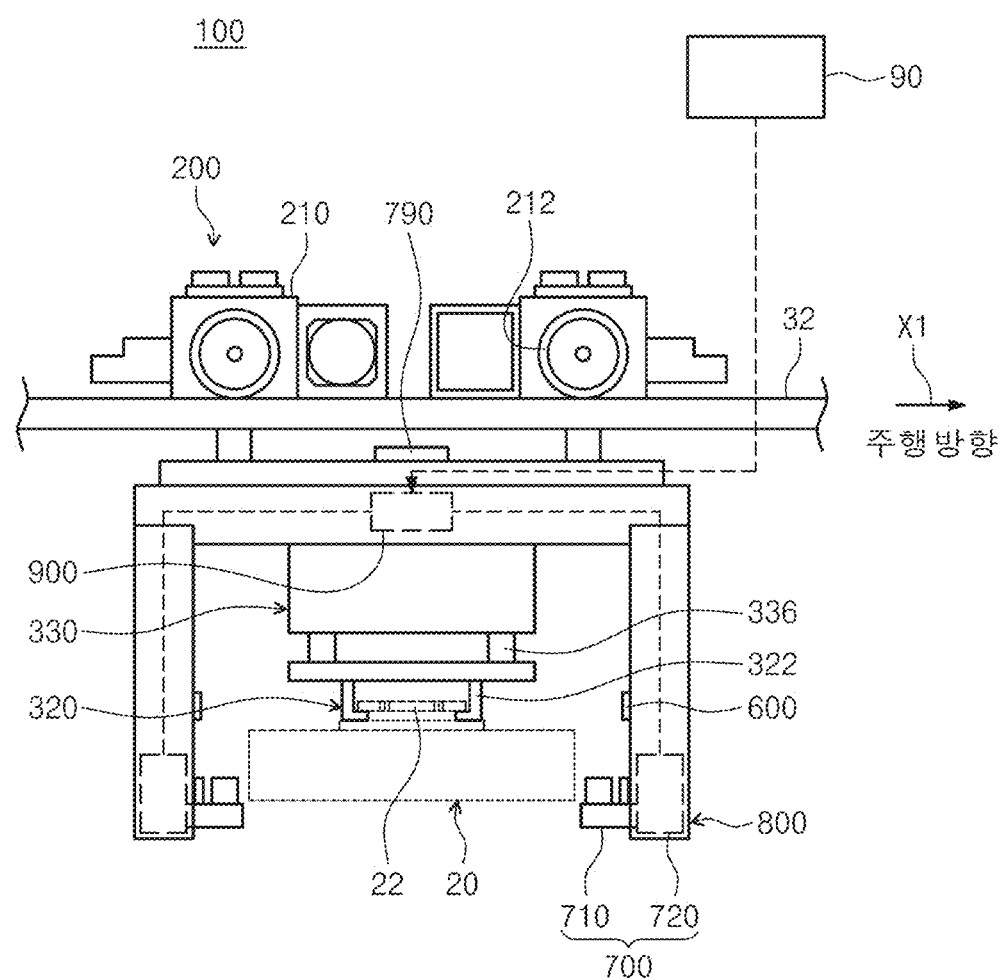
FIGS. 3 and 4 are views illustrating an article transfer apparatus.
Figure 4:
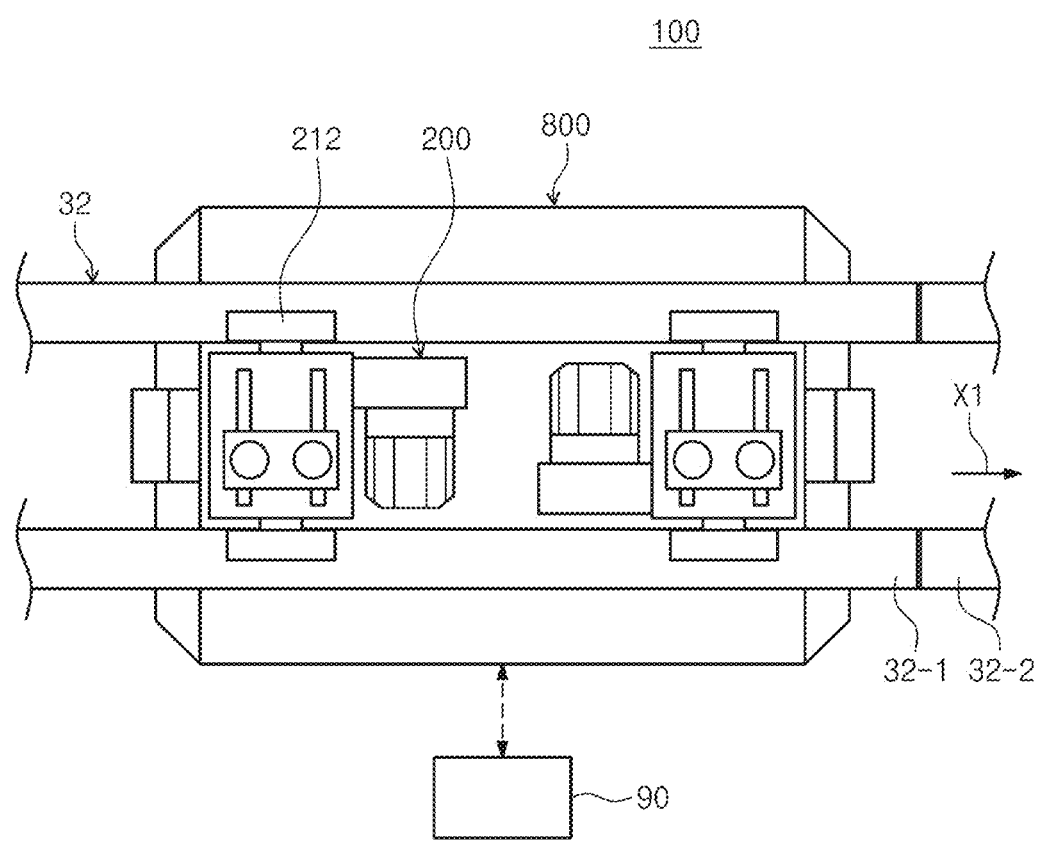
Figure 5A:
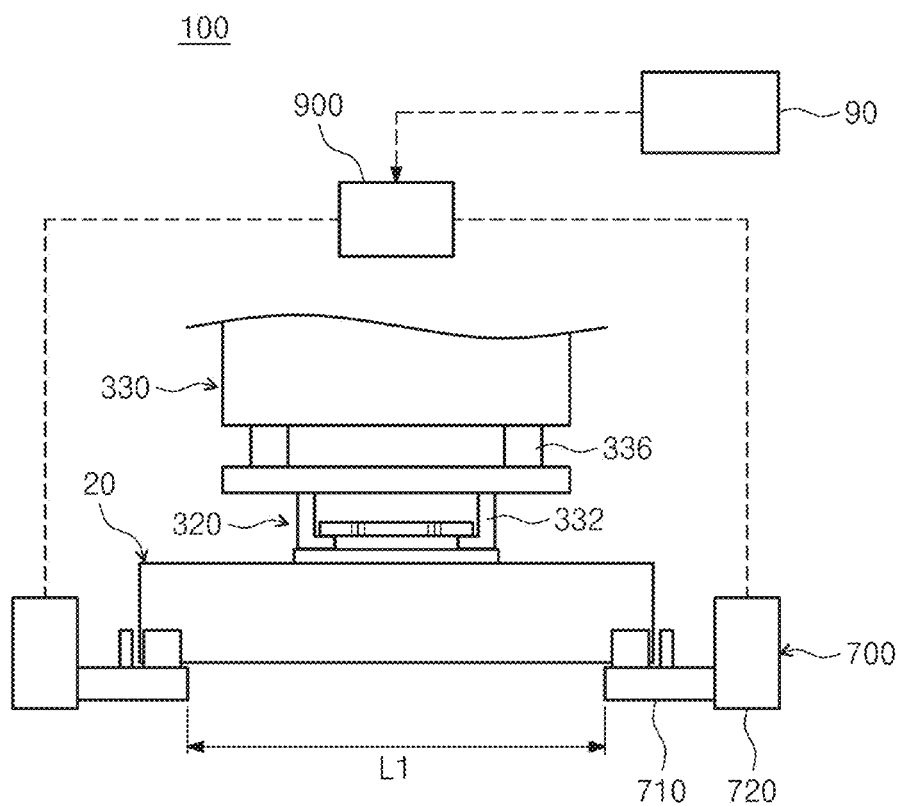
FIG. 5A is a view illustrating a drop preventing member when a large size article-to-be-transferred is transferred.
Figure 5B:
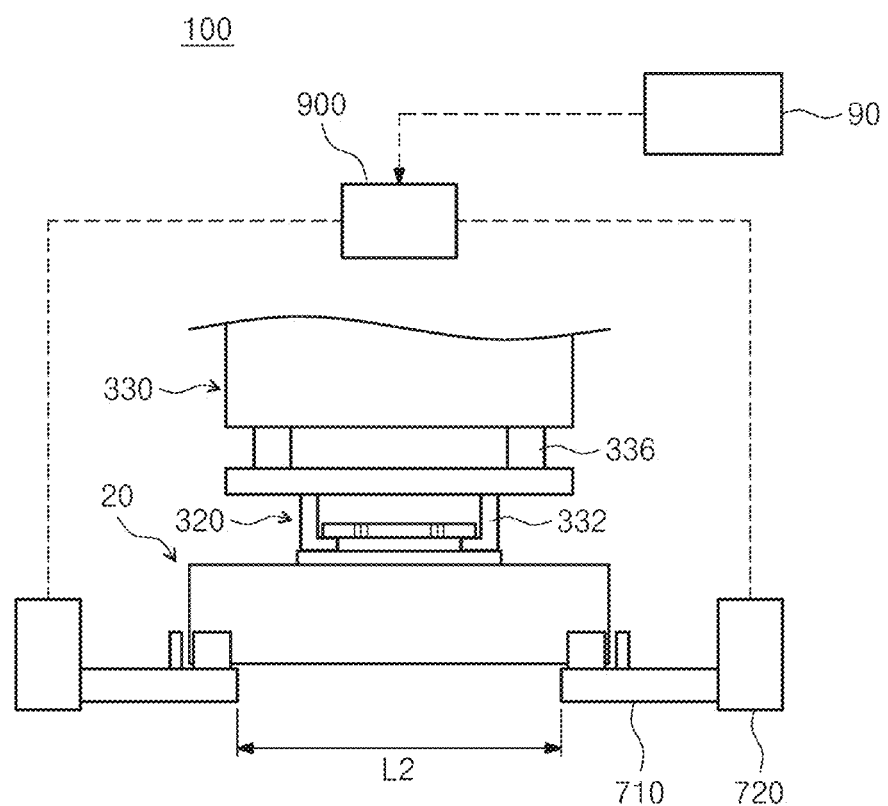
FIG. 5B is a view illustrating a drop preventing member when a small size article-to-be-transferred is transferred.

FIGS. 3 and 4 are views illustrating an article transfer apparatus. FIG. 5A is a view illustrating a drop preventing member when a large size article-to-be-transferred is transferred. FIG. 5B is a view illustrating the drop preventing member when a small size article-to-be-transferred is transferred.

As illustrated in FIGS. 3 to 5B, the article transfer apparatus 100 transfers the article-to-be-transferred 20 (hereinafter, referred to as a container). In the present embodiment, the article transfer apparatus transfers the container to a suspension site.

In the present embodiment, the article transfer apparatus 100 may be a transfer cart including a vehicle 200, a vehicle body 800, a hoist module 300, a drop preventing member 700, and a controller 900.

The vehicle 200 is a driving module that is driven along the driving rail 32 provided along a ceiling of a semiconductor manufacturing line by a separate driving part. The vehicle 200 may include bodies 210 having driving wheels 212 on opposite surfaces thereof. The body 210 may be provided with an actuator (for example, a driving motor) for rotating the driving wheels 212. The body 210 travels along the driving rail 32. In detail, the body 210 may travel while the driving wheel 212 are rotated while contacting the driving rail 32. Meanwhile, a steering wheel may be provided on an upper surface of the body 210. The steering wheel is configured to be moved along a horizontal direction that is perpendicular to a travel direction of the body 210. For example, the steering wheel may be moved in a leftward/rightward direction of the body 210. The steering wheel may selectively contact a straight steering rail (not illustrated) that guides a straight travel and a branched steering rail (not illustrated) that guide a branched travel.

The vehicle body 800 is connected to the vehicle 200 on a lower side of the driving rail 32. An upper side of the vehicle body 800 may be connected to a lower side of the vehicle 200 by at least one connector. The vehicle body 800 provides an interior space 802, in which the container 20 is located. The vehicle body 800 may have a structure, opposite sides and a lower side of which are opened, such that the container 20 is moved in the leftward/rightward direction and is moved in a downward direction in the interior space 802. Here, the opposite sides may be directions that are perpendicular to a travel direction of the article transfer apparatus 100.

For example, the hoist module 300 feeds the container 20 through an opened bottom surface of the vehicle body when the container 20 is to be carried from the mounting site into the interior space 802 or is to be carried from the interior space 802 to the mounting site.

The hoist module 300 is provided to the vehicle body 800. The hoist module 300 may load and unload the container. As an example, the hoist module 300 may include a gripper unit 320 that grips the container 20, and an elevation unit 330 that elevates the gripper unit 320.

The gripper unit 320 grips or releases the container 20. The gripper unit 320 may include grippers 322 that are connected to the elevation unit 330 through a plurality of elevation belts 336 and grip the container 20. Moreover, a flange 22 that is gripped by the grippers 322 may be provided on an upper side of the container 20.

The gripper unit 320 may include a griper driving part (not illustrated) that drives the grippers 322. For example, the gripper driving part may operate the grippers 322 by using a cam plate or a cam follower, and also may include a motor and a ball screw for moving the cam plate. However, the configuration of the gripper unit 320 itself may be variously changed, and thus, a range of the inventive concept is not limited thereto. The gripper unit 320 may be moved in the upward/downward direction by the elevation unit 330.

The elevation unit 330 moves the gripper unit 320 in the upward/downward direction. The elevation unit 330 may include a driver and an elevation belt 336. The elevation belts of the elevation unit 330 may be connected to the gripper unit 320. The elevation belt 336 may move the gripper unit 320 in the upward/downward direction with driving power generated by the driver. For example, the driver may generate driving power to wind or unwind the elevation belt 336 so as to move the gripper unit 320 in the upward/downward direction. However, the inventive concept is not limited thereto, and the elevation unit may be modified to various known apparatuses that may elevate the gripper unit 320.

The drop preventing member 700 is provided to the vehicle body 800. The drop preventing member 700 prevents drop of the container 20 while the vehicle 200 travels. As an example, the drop preventing member 700 includes a pair of support parts 710 that may be moved horizontally toward a bottom surface of the container 20, and a pair of driving parts 720 that adjust an interval between the pair of support parts 710. The driving part 720 is provided into the vehicle body 800. The drop preventing member 700 is configured such that the interval between the support parts 710 is adjusted as the pair of support parts 710 are moved in opposite directions along a widthwise direction (the travel direction) thereof. The interval between the pair of support parts 710 is adjusted by the driving part 720. The adjustment interval may include an interval L1 for a large size container (see FIG. 5A), an interval L2 for a small size container (see FIG. 5B), and an interval for standby (see FIG. 3) according to the size of the container 20 located in the interior space of the vehicle body 800. For reference, support pins that restrain horizontal movement of the container 20 may be provided to the support part 710. By the support pins, the container 20 may be restrained from being moved in a forward/rearward direction or in a transverse widthwise direction by a preset range or more.

The driving part 720 adjusts the interval between the support parts 710 according to a control signal of the controller 900.

The controller 900 may receive loading/unloading information provided through communication information of an upper level controller 90 to determine a size of the container 20. Furthermore, the controller 900 adjusts the interval between the pair of support parts 710 by driving the driving part 720 of the drop preventing member 700 according to the size of the container.

Here, the upper level controller 90 may be an OHT control system (OCS) that controls a plurality of article transfer apparatus that are to be introduced, in an integrated manner for a purpose of feeding the article-to-be-transferred in a semiconductor manufacturing process. The upper level controller 90 receives a command related to feeding from a manufacturing control system (MCS) that manages manufacturing apparatuses and deliver systems in an integrated manner. To allow the article transfer apparatus to complete a feeding operation for a shortest time, the upper level controller may search for a shortest path from a starting point to a destination, select the article transfer apparatus located at a location that is optimal for a feeding operation, and instruct a feeding command to the article transfer apparatus. Then, the loading/unloading information of the article-to-be-transferred that is to be transferred is provided to the controller 900 together.

Meanwhile, the vehicle body 800 is provided with a stock detecting sensor part 600. The stock detecting sensor part 600 is configured to detect the flange that is a common part of the container. The stock detecting sensor part 600 detects whether the container 20 is present in the interior of the vehicle body 800. The detected information may be provided to the controller 900.

The article transfer apparatus 100 having the above-described configuration identifies only whether the container 20 is accommodated while not measuring the size of the container 20. Furthermore, the loading/unloading information for the article-to-be-transferred is received and transferred through the upper level controller 90. With the information, the interval between the support parts 710 of the drop preventing member 700 is adjusted. The article transfer apparatus 100 registers article-to-be-transferred information in the loading/unloading information, and carries the article-to-be-transferred (container) based on the registered information.

A method for transferring an article in the article transfer apparatus of the inventive concept is as follows.

First, the hoist module 300 grips the container 20 and moves the container 20 into the interior space of the vehicle body 800. The stock detecting sensor part 600 detects whether the container 20 is located in the interior of the vehicle body 800. When the stock detecting sensor part 600 detects the container 20, the information is provided to the controller 900. Meanwhile, the controller 900 determines the size of the container 20 through the loading/unloading information received from the upper level controller 90. The controller 900 adjusts the interval between the pair of support parts 710 by controlling the driving part 720 of the drop preventing member 700 according to the size of the container 20.

In this way, the vehicle 200 travels to a transfer destination while the container 20 is prevented from dropping by the drop preventing member 700.

According to the embodiment of the inventive concept, a size of the article-to-be-transferred may be classified by receiving the loading/unloading information through the upper level controller, and through this, the movement interval of the drop preventing member may be adjusted whereby an article-to-be-transferred measuring process may be omitted and thus a transfer time may be shortened.

The effects of the inventive concept are not limited to the above-mentioned effects, and the unmentioned effects can be clearly understood by those skilled in the art to which the inventive concept pertains from the specification and the accompanying drawings.

In the above-described embodiment, the method has been described based on a flowchart with a series of operations or blocks, but a sequence of the operations is not restricted according to the inventive concept, and an operation may be performed in another sequence that is different from the above-described operation or simultaneously. Furthermore, it may be understood by an ordinary person in the art that the operations described in the flowchart are not exclusive, and another operation or one or more operations of the flowchart may be deleted while not influencing a scope of the inventive concept.

It is noted that the above embodiments are suggested for understanding of the inventive concept and do not limit the scope of the inventive concept, and various modifiable embodiments also fall within the scope of the inventive concept. It should be understood that the technical protection range of the inventive concept has to be determined by the technical spirit of the claims, and the technical protection range of the inventive concept is not limited to the lexical meaning of the claims but reaches even to the equivalent inventions.

What is claimed is:

1. An article transfer apparatus comprising:
    a vehicle configured to travel along a driving rail installed on a ceiling;
    a hoist module configured to grip a flange of an article-to-be-transferred to pick up the article-to-be-transferred;
    a vehicle body, on which the hoist module is mounted and which is connected to the vehicle;
    a drop preventing member provided in the vehicle body, and configured to prevent the article-to-be-transferred from dropping while the vehicle travels;
    a controller configured to receive loading/unloading information of the article-to-be transferred to determine a size of the article-to-be-transferred, and to drive the drop preventing member according to a size of the article-to-be transferred; and
    a stock detecting sensor part configured to detect whether the article-to-be-transferred is present in an interior of the vehicle body,
    wherein the controller receives the loading/unloading information of the article-to-be transferred through communication information of an upper level controller, and
    wherein the stock detecting sensor part is configured to detect the flange of the article-to-be-transferred to grip the flange and pick up the article-to-be-transferred by the hoist module.

2. The article transfer apparatus of claim 1, wherein the drop preventing member includes:
    a pair of support parts configured to be moved horizontally toward a bottom surface of the article-to-be-transferred; and
    a driving part provided in an interior of the vehicle body, and configured to adjust an interval between the pair of support parts.

3. The article transfer apparatus of claim 2, wherein the driving part adjusts the interval between the pair of support parts according to a control signal of the controller.

4. The article transfer apparatus of claim 3, wherein the article-to-be-transferred includes a container that accommodates a phase shift mask and a container that accommodates an extreme ultraviolet ray mask.

5. The article transfer apparatus of claim 4, wherein the controller drives the driving part such that the interval between the pair of support parts is adjusted to an interval for a small size container when it is identified, through the loading/unloading information of the article-to-be-transferred, that the article-to-be-transferred is a container that accommodates the phase shift mask.

6. The article transfer apparatus of claim 4, wherein the controller drives the driving part such that the interval between the pair of support parts is adjusted to an interval for a large size container when it is identified, through the loading/unloading information of the article-to-be-transferred, that the article-to-be-transferred is a container that accommodates the extreme ultraviolet ray mask.

7. An article transfer apparatus comprising:
    a vehicle configured to travel along a driving rail installed on a ceiling;
    a hoist module configured to grip a flange of an article-to-be-transferred to pick up the article-to-be-transferred;

a vehicle body, on which the hoist module is mounted and which is connected to the vehicle;

a drop preventing member provided in the vehicle body, and configured to prevent the article-to-be-transferred from dropping while the vehicle travels;

a stock detecting sensor part configured to detect a flange of the article-to-be-transferred to detect whether the article-to-be-transferred is present in an interior of the vehicle, the flange being configured to be gripped by the hoist module; and a controller configured to receive loading/unloading information received through communication information of an upper level controller and drive the drop preventing member according to a size of the article-to-be-transferred, wherein the drop preventing member includes
- a pair of support parts configured to be moved horizontally toward a bottom surface of the article-to-be-transferred; and
- a driving part provided in an interior of the vehicle body, and configured to adjust an interval between the pair of support parts, wherein the driving part adjusts the interval between the pair of support parts according to a control signal of the controller, wherein the controller receives the loading/unloading information of the article-to-be transferred through communication information of an upper level controller, and wherein the stock detecting sensor part is configured to detect the flange of the article-to-be-transferred to grip the flange and pick up the article-to-be-transferred by the hoist module.

8. The article transfer apparatus of claim 7, wherein the article-to-be-transferred includes a container that accommodates a phase shift mask and a container that accommodates an extreme ultraviolet ray mask, and wherein the controller drives the driving part such that the interval between the pair of support parts is adjusted to an interval for a small size container when it is identified, through the loading/unloading information of the article-to-be-transferred, that the article-to-be-transferred is a container that accommodates the phase shift mask.

9. The article transfer apparatus of claim 7, wherein the article-to-be-transferred includes a container that accommodates a phase shift mask and a container that accommodates an extreme ultraviolet ray mask, and wherein the controller drives the driving part such that the interval between the pair of support parts is adjusted to an interval for a large size container when it is identified, through the loading/unloading information of the article-to-be-transferred, that the article-to-be-transferred is a container that accommodates the extreme ultraviolet ray mask.

\* \* \* \* \*